(12) United States Patent
Koblis

(10) Patent No.: US 7,087,510 B2
(45) Date of Patent: Aug. 8, 2006

(54) METHOD OF MAKING BONDABLE LEADS USING POSITIVE PHOTORESIST AND STRUCTURES MADE THEREFROM

(75) Inventor: Mitchell Koblis, Los Banos, CA (US)

(73) Assignee: Tessera, Inc., San Jose, CA (US)

( * ) Notice: Subject to any disclaimer, the term of this patent is extended or adjusted under 35 U.S.C. 154(b) by 260 days.

(21) Appl. No.: 10/137,881

(22) Filed: May 2, 2002

(65) Prior Publication Data

US 2003/0008489 A1   Jan. 9, 2003

Related U.S. Application Data

(60) Provisional application No. 60/288,771, filed on May 4, 2001.

(51) Int. Cl.
*H01L 21/44* (2006.01)
*H01L 21/4763* (2006.01)
*H01L 21/30* (2006.01)

(52) U.S. Cl. .................... 438/612; 438/455; 438/641; 438/637; 438/686

(58) Field of Classification Search ........ 438/611–615, 438/637–641, 686, 118, 455
See application file for complete search history.

(56) References Cited

U.S. PATENT DOCUMENTS

| | | | |
|---|---|---|---|
| 4,505,029 A * | 3/1985 | Owyang et al. ............ 438/121 |
| 5,418,186 A * | 5/1995 | Park et al. .................... 438/614 |
| 5,518,964 A | 5/1996 | DiStefano et al. |
| 6,077,765 A * | 6/2000 | Naya ........................... 438/614 |
| 6,357,112 B1 | 3/2002 | DiStefano et al. |
| 6,448,171 B1 * | 9/2002 | Wang et al. ................. 438/614 |
| 6,515,233 B1 * | 2/2003 | Labzentis et al. ........... 174/254 |

OTHER PUBLICATIONS

Wolf et al., "Silicon Processing For the VLSI Era", vol. 1: Process Technology, Lattice Press, California, 1986, pp. 407-408.*

* cited by examiner

*Primary Examiner*—Ha Tran Nguyen
(74) *Attorney, Agent, or Firm*—Lerner, David, Littenberg Krumholz & Mentlik, LLP

(57) ABSTRACT

A microelectronic component having a plurality of leads are formed at their tip end with bondable material using a process including a mask of positive photoresist material. The leads can be rendered peelable from the substrate by, for example, plasma undercutting the leads. The tip ends of the leads can be bonded to contacts on an opposing microelectronic component, and separated therefrom in horizontal direction by virtue of the peelable leads to form S-shaped leads. The space between the microelectronic components can be filled with a compliant layer to form a microelectronic package.

32 Claims, 5 Drawing Sheets

US 7,087,510 B2

METHOD OF MAKING BONDABLE LEADS USING POSITIVE PHOTORESIST AND STRUCTURES MADE THEREFROM

CROSS-REFERENCED RELATED APPLICATION

The present patent application claims priority to U.S. Provisional Application No. 60/288,771, filed May 4, 2001, which is incorporated herein by reference in its entirety.

BACKGROUND OF THE INVENTION

The present invention relates in general to microelectronic elements and methods of making same, and more particularly, to interconnection structures having bondable leads made using positive photoresist material.

Microelectronic elements such as semiconductor chips are connected to external circuitry, such as the circuitry of a supporting substrate or circuit panel, through electrical contacts on the front face of the chip. Various processes for making these interconnections use prefabricated arrays of leads or discrete wires. For example, in tape automated bonding processes, a dielectric supporting tape such as a thin film of polyimide, includes an array of metallic leads on one surface of the dielectric film. The metallic leads are aligned with the contacts on the front face of the chip. The dielectric film is juxtaposed with the chip so that the leads extend over the front or contact bearing surface on the chip. The leads are then bonded to the contacts of the chip, such as by ultrasonic or thermocompression bonding. The terminals on the dielectric film may then be connected to external circuitry for electrically interconnecting the chip and the external circuitry.

In various microelectronic packages, it is often desirable to provide a connection between two components, which can accommodate relative movement between the components. For example, where a semiconductor chip is mounted to a circuit board, thermal expansion and contraction of the chip and circuit board can cause the contacts on the chip to move relative to the corresponding electrically conductive features of the circuit board. This can occur during service and can also occur during manufacturing operations as, for example, during soldering operations on the circuit board.

As illustrated in U.S. Pat. No. 5,518,964 ("the '964 patent"), the disclosure of which is incorporated herein by reference, movable interconnections between elements such as a semiconductor chip and another element can be provided by first connecting leads between the elements and then moving the elements away from one another through a preselected displacement so as to bend the leads. For example, a connection component may incorporate a dielectric body and leads extending along a bottom surface of the dielectric body. The leads may have first or fixed ends permanently attached to the dielectric element and connected to electrically conductive features such as terminals, traces or the like on the dielectric body. The leads may also have second ends releasably attached to the dielectric body. The dielectric body, with the leads thereon, may be juxtaposed with the chip and the second ends of the leads may be bonded to contacts on the chip.

Following bonding, the dielectric body and chip are moved away from one another, thereby bending the leads towards a vertically extensive disposition. During or after movement, a curable material such as a liquid composition is introduced between the elements. This is cured to form a compliant dielectric layer such as an elastomer or gel surrounding the leads. The resulting packaged semiconductor chip has terminals on the dielectric body connection component which are electrically connected to the contacts on the chip but which can move relative to the chip to compensate for thermal effects. The packaged chip may be mounted to a circuit board by solder-bonding the terminals to conductive features on the circuit board. Relative movement between the circuit board and the chip due to thermal effects is taken up in the moveable interconnection provided by the leads and the compliant layer.

In order to achieve bonding of the leads to the contacts on the chip, a bondable material such as tin or tin alloys is deposited onto the second ends or tips of the leads. The bondable material can be deposited by electroplating processes using a patterned masked material and plating solder through the formed openings in the mask. However, electroplating processes are not compatible in certain microelectronic components where the leads are not all electrically interconnected to a common bus. This is often the case in the aforementioned microelectronic components.

It is also known to deposit bondable material onto the tips of leads using conventional solder and reflow application techniques. The tips of the leads are provided with a metal pad which acts as a diffusion barrier so that the lead material, typically copper, does not diffuse into the bondable material, as well as to promote wetting of the bondable material during the reflow process. In forming the leads and pads, there is required the multiple application of a photoresist mask which is patterned to allow for the sequential deposition of the metal layers forming the leads and pads. Due to the projection of the pads, there is a limitation as to the application equipment which can be used for depositing the photoresist material. For example, the projecting pads will interfere with certain roller coating equipment known for applying photoresist material.

Accordingly, there is the need for improvements in methods of making microelectronic components having bondable leads by application of solder material to the lead tips. There is further the need for improvements in methods of making microelectronic components which provide greater flexibility in photoresist application. Still further, there is the need for methods of making microelectronic components which use a single photoresist mask for forming leads and solder ball pads.

SUMMARY OF THE INVENTION

In accordance with one embodiment of the present invention there is disclosed a method of making a solder ball pad on a lead supported on a dielectric substrate, the method comprising depositing a positive photoresist material over a metal layer supported on the substrate; forming an opening in the photoresist material exposing a portion of the metal layer; depositing at least one metal through the opening onto the exposed surface of the metal layer forming a solder ball pad; and removing the photoresist material from the metal layer.

The aforesaid method includes enlarging the opening in the photoresist material and depositing through the enlarged opening a layer of another metal surrounding the solder ball pad, wherein the another metal comprises gold and gold alloys, and includes removing portions of the metal layer using the photoresist material as a mask to define a lead extending from the solder ball pad over the surface of the substrate. The method includes depositing a bondable material onto an exposed surface of the another metal, wherein the bondable material comprises solder material. The method includes depositing through the opening in the photoresist material a layer of bondable material onto the solder ball pad, and includes enlarging the opening in the photoresist material and depositing through the enlarged opening a layer of another metal surrounding the layer of bondable material, wherein the bondable material comprises solder material and wherein the another metal comprises gold and gold alloys. The method includes removing portions of the metal layer using the photoresist material as a mask to define a lead extending from the solder ball pad over the surface of the substrate and includes at least partially separating the lead from the surface of the substrate.

In accordance with another embodiment of the present invention there is described a method of making a microelectronic component comprising providing a dielectric substrate having a surface supporting an electrically conductive layer; coating the electrically conductive layer with positive photoresist material; forming a plurality of openings in the photoresist material exposing the electrically conductive layer therein; depositing a first metal layer within the openings over the exposed electrically conductive layer; selectively removing the electrically conductive layer to form leads extending over the surface of the substrate in electrical contact with the first metal layer; and removing the photoresist material from the electrically conductive layer.

The aforesaid method includes enlarging the openings in the photoresist material and depositing through the enlarged opening a second metal layer over the first metal layer, includes depositing a bondable material onto an exposed surface of the second metal layer, and includes patterning the photoresist material to define the leads prior to the selectively removing the electrically conductive layer, wherein the thickness of the first and second metal layer is less than the thickness of the photoresist material. The method includes at least partially separating the leads from the surface of the substrate and includes depositing a bondable material through the openings in the photoresist material over the exposed surface of the first metal layer. The method includes enlarging the openings in the photoresist material and depositing through the enlarged openings a second metal layer over the bondable material, wherein the first metal layer comprises nickel, the second metal layer comprises gold and gold alloys and the bondable material comprises tin and tin alloys, and includes heating the microelectronic component to a temperature to cause the bondable material to reflow.

In accordance with another embodiment of the present invention there is described a method of making a microelectronic component comprising providing a dielectric substrate having a surface supporting a metal layer; depositing a positive photoresist material over the metal layer; patterning the photoresist material to delineate on the metal layer a plurality of pad regions exposed through openings formed in the photoresist material and a plurality of lead regions covered by the photoresist material extending over the surface of the substrate from the pad regions; depositing a first electrically conductive material onto the metal layer through the openings in the photoresist material in the pad regions; removing portions of the metal layer uncovered by the patterning of the photoresist material to form leads in electrical contact with the electrically conductive material in the pad regions; and removing residual photoresist material from the metal layer.

The aforesaid method includes enlarging the openings in the photoresist material and depositing a second electrically conductive material through the enlarged openings onto an exposed surface of the first electrically conductive material, and includes depositing a bondable material onto an exposed surface of the second electrically conductive material, wherein the thickness of the first and second electrically conductive materials is less than the thickness of the photoresist material.

The method includes depositing a bondable material through the openings onto an exposed surface of the first electrically conductive material, and includes enlarging the openings in the photoresist material and depositing through the enlarged openings a second electrically conductive material over the bondable material, and further includes heating the microelectronic component to a temperature to cause the bondable material to reflow. The method includes at least partially separating the leads from the surface of the substrate.

The invention also discloses a solder pad on a lead supported on a dielectric substrate made in accordance with the aforesaid method and a microelectronic component made in accordance with the aforesaid method.

In accordance with another embodiment of the present invention there is described a method of making a microelectronic packaging comprising providing a first microelectronic component having a front surface supporting a plurality of contacts; providing a second microelectronic component having a surface supporting a plurality of leads, the second microelectronic component made by providing a dielectric substrate having a surface supporting an electrically conductive layer; coating the electrically conductive layer with a positive photoresist material; forming a plurality of openings in the photoresist material exposing the electrically conductive layer therein; depositing a first metal layer within the openings over the exposed electrically conductive layer; selectively removing the electrically conductive layer to form leads extending over the surface of the substrate in electrical contact with the first metal layer; and removing the photoresist material from the electrically conductive layer; at least partially separating the leads from the substrate; positioning the second microelectronic component overlying the first microelectronic component; bonding an end of the leads to the contacts with a bondable material therebetween; and separating the first and second microelectronic components from each other into spaced apart relationship whereby the end of the leads remain bonded to the contacts and the other end of the leads remain supported by the dielectric substrate.

The aforesaid method includes enlarging the openings in the photoresist material and depositing through the enlarged openings a second metal layer over the first metal layer, and depositing a bondable material onto an exposed surface of the second metal layer, wherein the thickness of the first and second metal layers is less than the thickness of the photoresist material. The method includes patterning the photoresist material to define the leads prior to the selectively removing the electrically conductive layer and at least partially separating the leads from the surface of the substrate. The method includes depositing a bondable material through the openings in the photoresist material over the exposed surface of the first metal layer and enlarging the openings in the photoresist material and depositing through the enlarged openings a second metal layer over the bondable material, wherein the first metal layer comprises nickel, the second metal layer comprises gold and gold alloys and the bondable material comprises tin and tin alloys. The method further includes heating the microelectronic component to a temperature to cause the bondable material to reflow.

In accordance with another embodiment of the present invention there is described a method of making a microelectronic packaging comprising providing a first microelectronic component having a front surface supporting a plurality of contacts; providing a second microelectronic component having a surface supporting a plurality of leads, the second microelectronic component made by providing a dielectric substrate having a surface supporting a metal layer; depositing a positive photoresist material over the metal layer; patterning the photoresist material to delineate on the metal layer a plurality of pad regions exposed through openings formed in the photoresist material and a plurality of lead regions covered by the photoresist material extending over the surface of the substrate from the pad regions; depositing a first electrically conductive material onto the metal layer through the openings in the photoresist material in the pad regions; removing portions of the metal layer uncovered by the patterning of the photoresist material to form the leads in electrical contact with the electrically conductive material in the pad regions; removing residual photoresist material from the metal layer; at least partially separating the leads from the substrate; positioning the second microelectronic component overlying the first microelectronic component; bonding the leads to the contacts with a bondable material therebetween; and separating the first and second microelectronic components from each other into spaced apart relationship whereby a portion of the leads remain bonded to the contacts and another portion of the leads remain supported by the dielectric substrate.

The aforesaid method includes enlarging the openings in the photoresist material and depositing a second electrically conductive material through the enlarged openings onto an exposed surface of the first electrically conductive material and depositing a bondable material onto an exposed surface of the second electrically conductive material, wherein the thickness of the first and second electrically conductive materials is less than the thickness of the photoresist material.

The method includes depositing a bondable material through the openings onto an exposed surface of the first electrically conductive material and enlarging the openings in the photoresist material and depositing through the enlarged openings a second electrically conductive material over the bondable material, including heating the microelectronic component to a temperature to cause the bondable material to reflow.

BRIEF DESCRIPTION OF THE DRAWINGS

The above description, as well as further objects, features and advantages of the present invention will be more fully understood with reference to the following detailed description of a method of making bondable leads using positive photoresist and structures made therefrom, when taken in conjunction with the accompanying drawings, wherein.

DETAILED DESCRIPTION

In describing the preferred embodiments of the subject matter illustrated and to be described with respect to the drawings, specific terminology will be resorted to for the sake of clarity. However, the invention is not intended to be limited to the specific terms so selected, and is to be understood that each specific term includes all technical equivalence which operate in a similar manner to accomplish a similar purpose.

Figure 1:
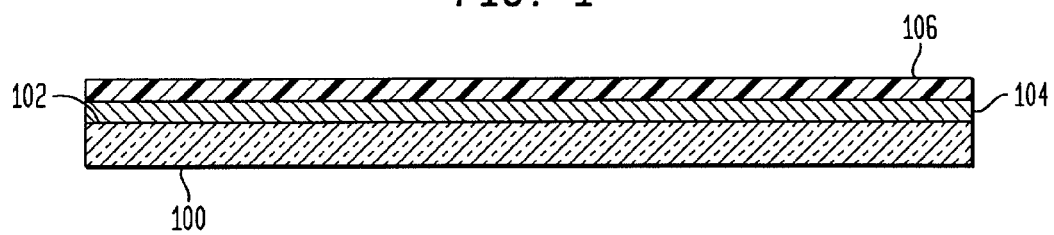
FIGS. 1–8 are sequential front elevational views showing the steps in a process of making a microelectronic component having leads with bondable material in accordance with one embodiment of the present invention.

Referring now to the drawings, wherein like reference numerals represent like elements, there is shown in FIG. 1 a substrate 100 formed of dielectric material, for example, polymer material such as polyimide and the like. The substrate 100 may be rigid or flexible having an upper surface 102. A metal layer 104 is formed on the upper surface 102 of the substrate 100. The metal layer may be formed using conventional techniques, for example, by electroless or electroplating techniques or laminating a pre-formed metal sheet onto the upper surface using a suitable adhesive. The metal layer 104 will ultimately be patterned to form leads, conductive traces, contact pads and/or other conductive elements of the circuit for the microelectronic component. Hence, the metal layer 104 is preferably formed from copper, copper/gold alloys and the like.

A layer of positive photoresist material 106 is applied over the exposed surface of the metal layer 104. The photoresist layer 106 may be applied using any conventional application technique, such as roller coating, spin coating, doctor blade and the like. In using positive photoresist material, the layer 106 is exposed to UV light in a pattern wherever the photoresist material is to be removed. Exposure to the UV light changes the chemical structure of the photoresist material so that it becomes more soluble in a developer. The exposed photoresist material is then washed away by the developer solution, leaving windows exposing the underlying material. Therefore, the photomask (not shown) used in patterning the photoresist layer 106 contains apertures disposed in a pattern corresponding to the pattern which is to be formed on the photoresist layer. Since only those areas of the photoresist layer 106 which are exposed to UV light are removed, a single photoresist layer may be patterned multiple times in a processing sequence to define other windows and circuit elements and features as desired. Positive photoresists other than those which are UV activated can be used such as X-ray or E-beam activated positive photoresists.

By way of one example, positive photoresist materials include a base resin, a photosensitive compound and an organic solvent. Phenol-formaldehyde polymer is one of the basic resins used in known positive photoresist materials. When the polymer is exposed to light energy of the desired wavelength, the polymer changes from an insoluble state to a soluble state. This process is referred to as photosolubilization. The polymer chemistry changes from the phenol-formaldehyde structure to a carboxylic acid, which dissolves in the base developer. Positive photoresist materials are available from a number of sources, for example, Kodak and Shipley.

Figure 2:
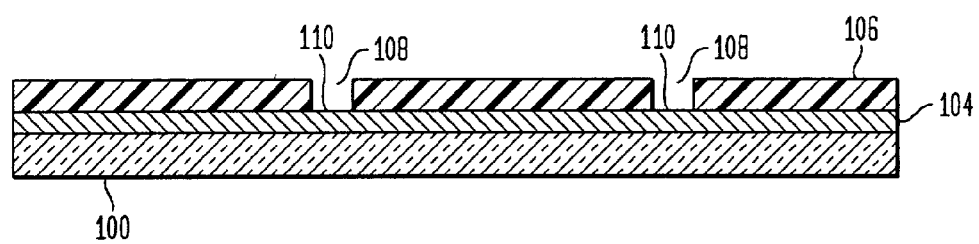
Figure 3:
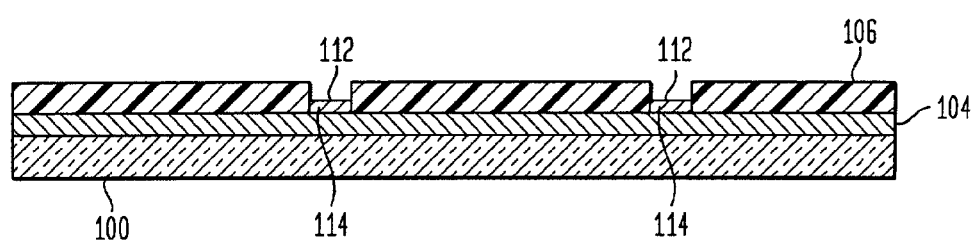

Using a suitable mask, the positive photoresist layer 106 is patterned by exposing to light those regions which will form the tips of the leads, and hence, the location of application for the bonding material. As shown in FIG. 2, a plurality of openings 108 are formed in the positive photoresist layer 106 after developing so as to expose the surface 110 of the underlying metal layer 104. A metal diffusion barrier layer 112 is deposited through the openings 108 onto the surface 110 of the metal layer 104. In accordance with the preferred embodiment, the barrier layer 112 is an electrolytically plated layer of nickel having a thickness of about 5 microns as shown in FIG. 3. The barrier layer 112 may be formed from other such metals. The barrier layer forms a plurality of bumps or pads 114 on the surface of the metal layer 104 at the tip ends of the leads which are to be defined from the metal layer at a later stage in the process of making microelectronic components in accordance with the present invention.

Figure 4:
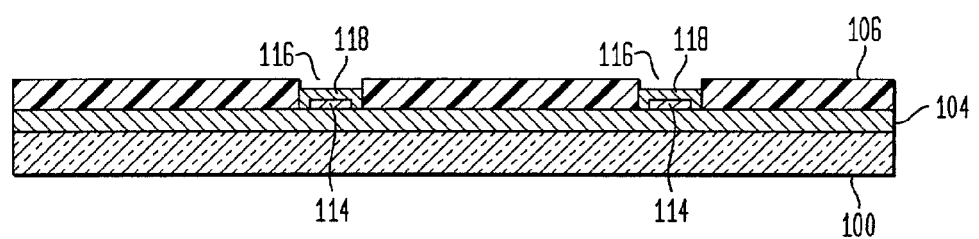

Referring to FIG. 4, the positive photoresist layer 106 is exposed a second time to enlarge the openings 108 surrounding the pads 114. This second exposure of the positive photoresist layer 106 would not be possible using negative resist material. In this regard, the use of negative resist material would require that the first photoresist layer be stripped after defining the openings 108 and a second layer of negative photoresist be applied in order to form enlarged openings 116. The enlarged openings 116, which surround the pads 114, allow for the depositing of a metal layer 118 encapsulating the pads 114. The metal layer 118 is preferably a gold layer which is etch resistant, electrically conductive, and wettable to the bonding material to be applied hereinafter. In accordance with one embodiment, the thickness of the barrier layer 112 and metal layer 118 is less than the thickness of the photoresist layer 106.

The metal layer 104 will be etched at a later stage to form the leads, circuit traces and other circuit features using a suitable etchant. The gold layer 118 protects the pads 114 from being etched during etching of the metal layer 104. It is therefore contemplated that the gold metal layer 118 may be eliminated provided that an etchant is selected which does not attack the barrier layer 112 which forms the pads 114. For example, suitable etchants which will not attack the nickel barrier layer 112 include ammoniacal etchants, i.e., ammonium based etchants. Accordingly, although it is preferred to provide metal layer 118 surrounding the pads 114, the metal layer is not considered an essential feature of the present invention.

Figure 5:
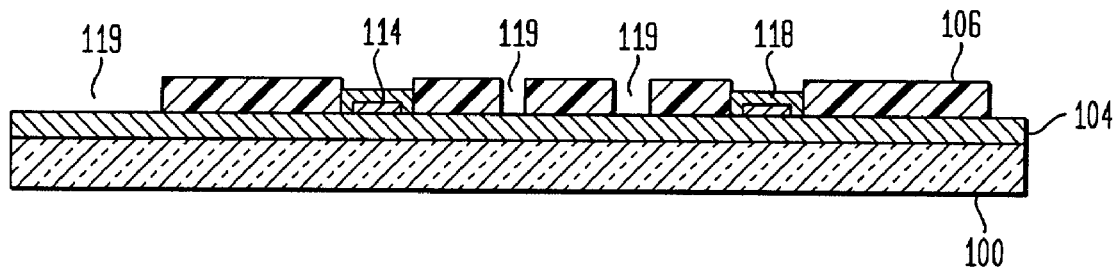
Figure 6:
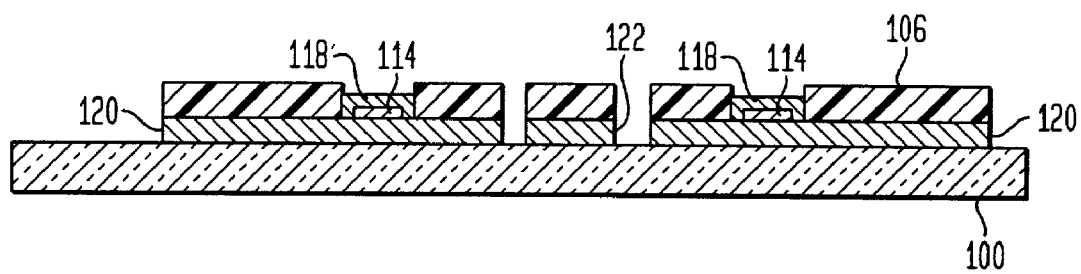
Figure 7:
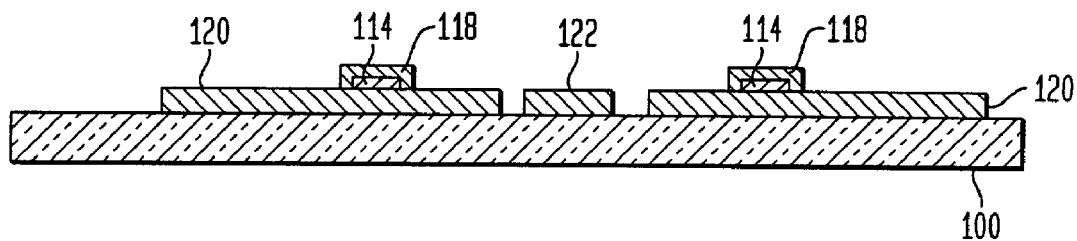

The positive photoresist layer 106 is exposed a third time so as to define the leads, traces and other circuit features as shown in FIG. 5 by means of openings 119. Using a suitable etchant, the metal layer 104 is etched to the upper surface 102 of the substrate 100 to define a plurality of leads 120 and circuit traces 122 as shown in FIG. 6. The photoresist layer 106, as shown in FIG. 7, is removed using a suitable positive photoresist stripper composition which will not attack the metal layers used in forming the pads 114 and leads 120. A variety of organic solvents can be used such as acids and/or hydrogen peroxide solutions. Specific positive photoresist stripping material are well known in the art which are available from a number of standard commercial sources.

A portion of the leads 120 can be made peelable from the dielectric substrate 100 using a variety of techniques. For example, using a plasma etch process, a portion of the substrate 100 underlying the leads 120 can be undercut to minimize adhesion and therefore rendering that portion of the leads peelable. By way of example, one such lead undercutting process is disclosed in U.S. patent application Ser. No. 09/020,750 entitled "Components With Releasable Leads" filed on Feb. 9, 1998, the disclosure of which is incorporated herein by reference. Other methods of forming peelable leads are disclosed in, for example, U.S. patent application Ser. No. 09/200,100 entitled "Connection Component With Peelable Leads" filed on Nov. 25, 1998, the disclosure of which is incorporated herein by reference. Still other methods for forming peelable leads which can be used in practicing the present invention are disclosed in U.S. patent application Ser. No. 09/549,638 entitled "Components With Releasable Leads", filed on Apr. 14, 2000; and U.S. patent application Ser. No. 09/566,273 entitled "Components With Releasable Leads", filed on May 5, 2000, the disclosures of which are incorporated herein by reference.

Figure 8:
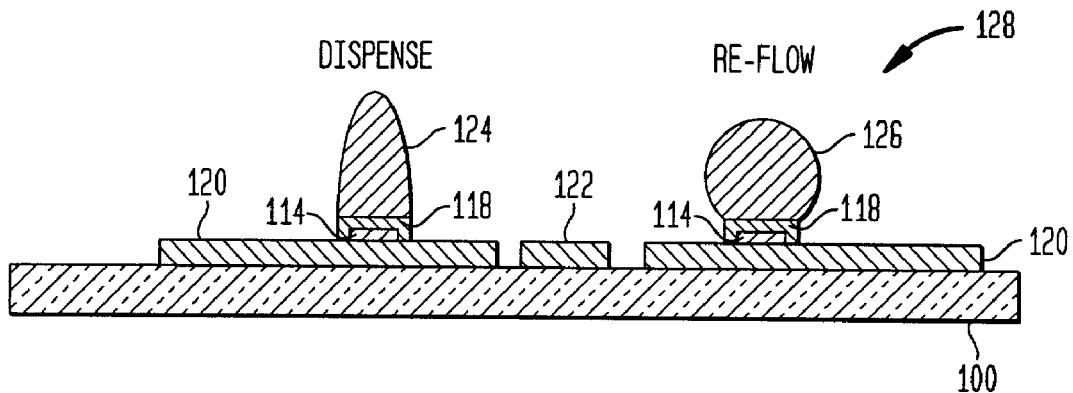

The leads 120 can be rendered peelable either before or after applying bonding material to the leads. In accordance with the preferred embodiment, bondable material 124 is deposited onto the metal layer 118 overlying the pads 114 as shown in the left hand portion of FIG. 8. By way of example, suitable bonding material includes tin, tin alloys, tin-palladium, silver-bismuth, nickel with gold bumps and the like. The bondable material 124 is heated to a temperature to allow its reflow so as to form the spherical solder balls 126 as shown in the right hand portion of FIG. 8. It is preferred that the leads 120 be rendered peelable after application of the bondable material 124. In this regard, the presence of any photoresist material such as may be used when depositing the bondable material 124 can affect the rate of undercutting of the leads. In addition, as the leads 120 once rendered peelable are relatively weak, the further processing such as application of the bonding material 124 and handling of the substrate 100 can potentially result in damage to the leads. However, as noted hereinabove, it is contemplated that the leads 120 can be rendered peelable before or after application of the bonding material 124 and/or rendering the bonding material flowable to form the solder balls 126.

Figure 9:
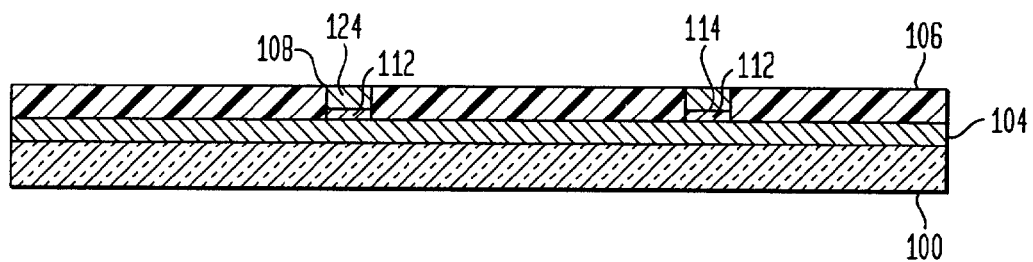
FIGS. 9–14 are sequential front elevational views showing the steps in a process of making a microelectronic component having leads with bondable material in accordance with another embodiment of the present invention.
Figure 10:
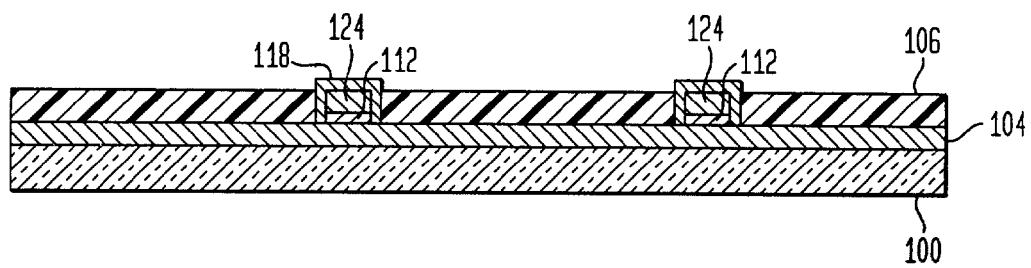
Figure 11:
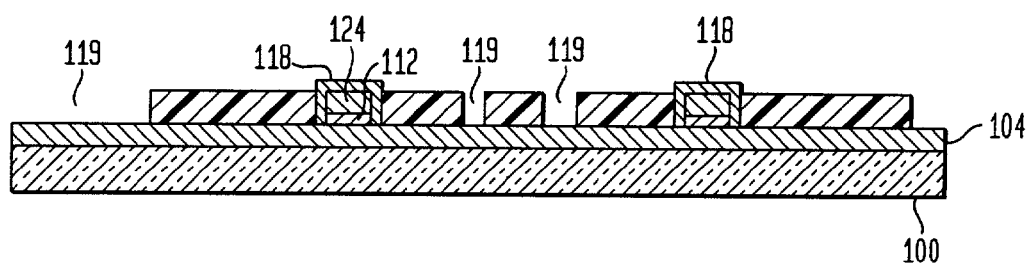
Figure 12:
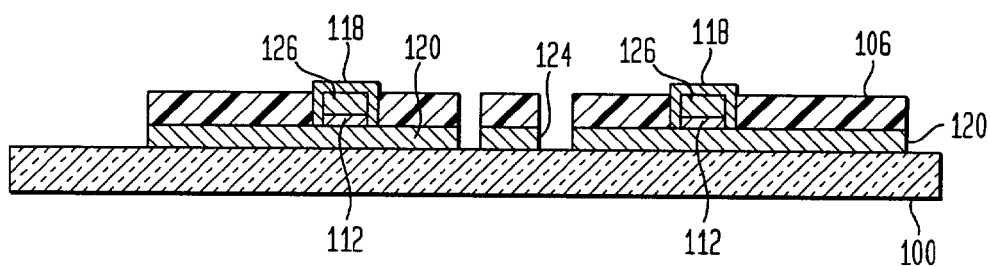
Figure 13:
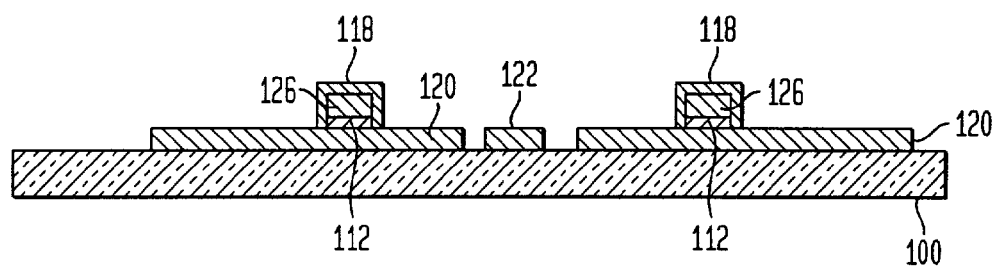
Figure 14:
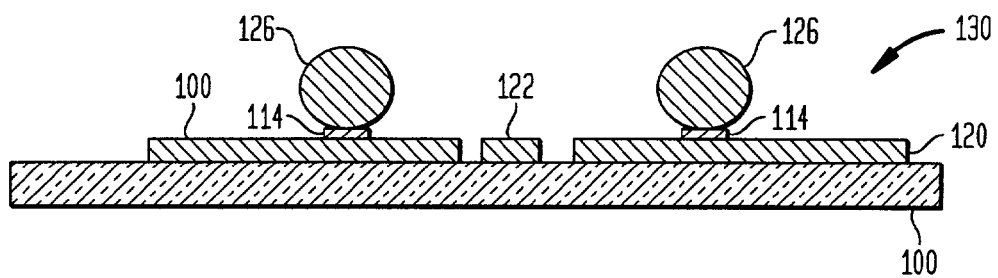

Referring now to FIGS. 9–14, there will be described another embodiment of the present invention for making bondable leads using positive photoresist material. As shown in FIG. 9, a layer of bondable material 124 is deposited through openings 108 in the photoresist layer 106 onto the surface of pads 114 formed by the diffusion barrier layer 112. The openings 118 are plasma etched to create enlarged openings around the bondable material 124 and barrier layer 112 which forms the pads 114. A metal layer 118, for example, such as gold or a gold alloy, is plated through the enlarged opening to encapsulate the bondable material 124 and underlying barrier layer 112 as shown in FIG. 10. By way of example, the metal layer 118 has a portion extending above the surface of the photoresist material 106. As previously described, the photoresist material 106 is used as a mask to pattern the metal layer 104 to define leads 120 and circuit traces 124 as shown in FIG. 11 via openings 119. Upon etching the metal layer 104, as shown in FIG. 12, the leads 120 and circuit traces 124 are defined on the substrate 100. The photoresist material 106 is stripped using a suitable stripper material, as previously described, thereby exposing the surface of the leads 120 and traces 122 as shown in FIG. 13. Subsequently, the bondable material 124 is heated to reflow the material thereby forming solder balls 126 as shown in FIG. 14. During the reflow process, the metal layer 118, preferably gold, will diffuse into the bondable material 124. The underlying barrier layer 112 will prevent the copper layer from diffusing into the bondable material 124 during the reflow process, as well promoting wetting. In the manner as previously described, the leads 120 can be rendered peelable from the dielectric substrate 100.

Figure 15:
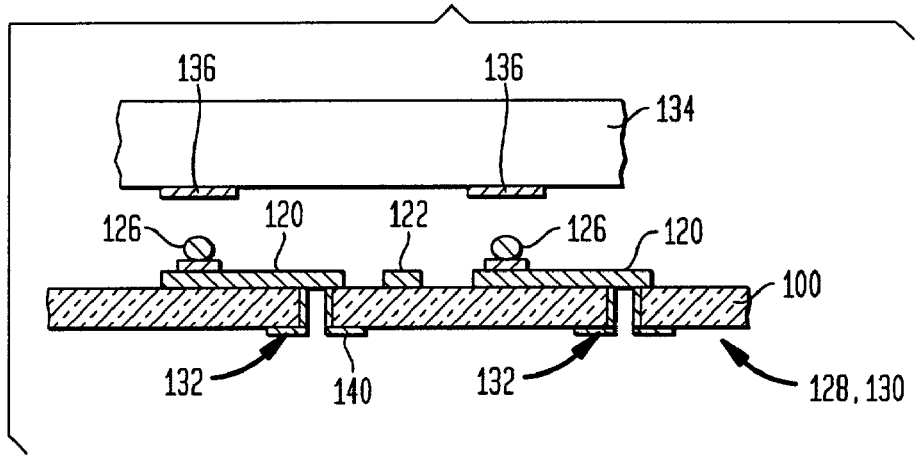
FIGS. 15–17 are sequential front elevational views showing the steps in making a microelectronic package using a microelectronic component constructed in accordance with another embodiment of the present invention.
Figure 16:
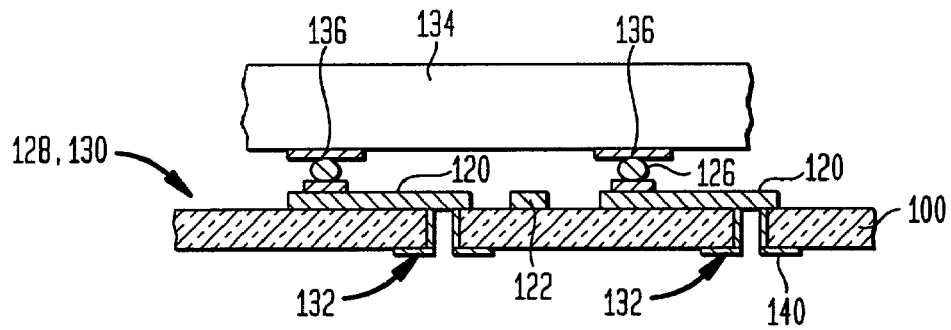
Figure 17:
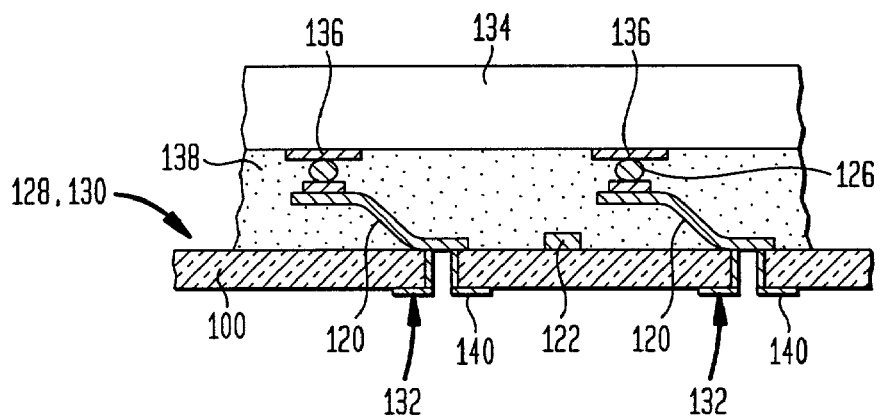

The completed microelectronic component 128, 130 can be used in a variety of interconnection applications such as interposers and the like for forming microelectronic packages with another microelectronic component such as a semiconductor chip. With reference to FIGS. 15–17, a microelectronic component 134, such as a semiconductor chip, semiconductor wafer, circuitized printed circuit board and the like has a plurality of contacts 136. A microelectronic component 128, 130 is positioned opposing the contact face side of the microelectronic component 134. As specifically shown in FIGS. 15 and 16, the solder balls 126 on each of the leads 120 are aligned with a corresponding contact 136 on the microelectronic component 134. The leads 120 on the microelectronic component 128, 130 are bonded to the contact pads 136 via the solder balls 126 as shown in FIG. 16.

The microelectronic components are vertically, and preferably also horizontally separated from one another by using any suitable means. For example, the microelectronic components 128, 130, 134 may be respectively attached to an upper or lower platen (not shown) such as by vacuum. The vertical and horizontal movement of the platens will cause the leads 120 to peel from the surface of the substrate 100 to be vertically extended and form a generally S-shaped configuration as shown in FIG. 17. During or after the separation of the microelectronic components, a flowable material such as a liquid composition 138 capable of curing to form a compliant dielectric material such as a gel or an elastomer can be injected between the microelectronic components. For example, the curable liquid composition 138 may be a silicone or epoxy composition which forms a compliant flexible body. On the other hand, it is also contemplated that a curable liquid composition 138 may be in the nature of a rigid polymer material if desired. If the liquid composition 138 is injected during the movement step, the pressure of the composition will help to force the microelectronic components, such as a semiconductor chip or wafer, a packaged chip or a multichip module away from each other either with or without assistance from the platens. The liquid composition 138 is then cured to form a compliant dielectric layer.

The leads 120 may be terminated around the periphery of the substrate 100 by the conductive traces 122 extending outwardly to the substrate periphery whereby there can be provided contact pads (not shown). In addition, the substrate 100 may be formed with one or more conductive vias 132. The vias may be formed as plated through holes through the substrate 100 to electrically contact one end of the leads 120. The other end of the vias may be provided with contacts 140 on the opposing surface of the substrate 100. The vias 132 in addition to being through holes, may also be filled with a metal material, such as a bondable material for connection to another microelectronic component.

Although the invention herein has been described with reference to particular embodiments, it is to be understood that these embodiments are merely illustrative of the principles and application of the present invention. It is therefore to be understood that numerous modifications may be made to the illustrative embodiments and that other arrangements may be devised without departing from the spirit and scope of the present invention as defined by the appended claims.

The invention claimed is:

1. A method of making a solder ball pad on a lead supported on a dielectric substrate, said method comprising:
    depositing a positive photoresist material over a metal layer supported on said substrate;
    forming an opening in said photoresist material exposing a portion of said metal layer;
    forming a solder ball pad by depositing at least one metal through said opening onto the exposed surface of said metal layer;
    enlarging said opening in said photoresist material and depositing through the enlarged opening a layer of another metal surrounding said solder ball pad;
    removing portions of said metal layer using said photoresist material as a mask to define a lead extending from said solder ball pad over the surface of said substrate; and
    removing said photoresist material from said metal layer.

2. The method of claim 1, wherein said at least one metal comprises nickel.

3. The method of claim 1, wherein said another metal comprises gold and gold alloys.

4. The method of claim 1, wherein at least a portion of said lead is peelable from said substrate.

5. The method of claim 1, further including depositing a bondable material onto an exposed surface of said another metal.

6. The method of claim 5, wherein said bondable material comprises solder material.

7. The method of claim 1, further including depositing through said opening in said photoresist material a layer of bondable material onto said solder ball pad.

8. The method of claim 7, further including enlarging said opening in said photoresist material and depositing through said enlarged opening a layer of another metal surrounding said layer of bondable material.

9. The method of claim 8, wherein said bondable material comprises solder material.

10. The method of claim 8, wherein said another metal comprises gold and gold alloys.

11. The method of claim 8, further including removing portions of said metal layer using said photoresist material as a mask to define a lead extending from said solder ball pad over the surface, of said substrate.

12. The method of claim 11, further including at least partially separating said lead from the surface of said substrate.

13. The method of claim 8, further including heating said bondable material and layer of another metal to reflow said material and said metal to form a solder ball therefrom.

14. A method of making a microelectronic component having a plurality of solder balls pads comprising:
    providing a dielectric substrate having a surface supporting an electrically conductive layer;
    coating said electrically conductive layer with positive photoresist material;
    forming a plurality of openings in said photoresist material exposing said electrically conductive layer therein;
    forming a plurality of solder ball pads by depositing a first metal layer within said openings over the exposed electrically conductive layer;
    selectively removing said electrically conductive layer to form leads extending over said surface of said substrate in electrical contact with said first metal layer;
    enlarging said openings in said photoresist material and depositing through said enlarged opening a second metal layer over said first metal layer;
    patterning the said photoresist material to define said leads prior to said selectively removing said electrically conductive layer; and
    removing said photoresist material from said electrically conductive layer.

15. The method of claim 14, further including depositing a bondable material onto an exposed surface of said second metal layer.

16. The method of claim 14, wherein the thickness of said first and second metal layer is less than the thickness of said photoresist material.

17. The method of claim 14, further including at least partially separating said leads from said surface of said substrate.

18. The method of claim 14, further including depositing a bondable material through said openings in said photoresist material over the exposed surface of said first metal layer.

19. The method of claim 18, further including enlarging said openings in said photoresist material and depositing through the enlarged openings a second metal layer over said bondable material.

20. The method of claim 19, wherein said first metal layer comprises nickel, said second metal layer comprises gold and gold alloys, and said bondable material comprises tin and tin alloys.

21. The method of claim 19, further including at least partially separating said leads from said surface of said substrate.

22. The method claim 19, further including heating said microelectronic component to a temperature to cause said bondable material to reflow.

23. A method of making a microelectronic component having a plurality of solder ball pads comprising:
    providing a dielectric substrate having a surface supporting a metal layer;
    depositing a positive photoresist material over said metal layer;
    patterning said photoresist material to delineate on said metal layer a plurality of pad regions exposed through openings formed in said photoresist material;
    forming a plurality of solder ball pads by depositing a first electrically conductive material onto said metal layer through said openings in said photoresist material in said pad regions;
    patterning said photoresist material to delineate a plurality of lead regions covered by said photoresist material extending over said surface of said substrate from said pad regions;
    removing portions of said metal layer uncovered by said later patterning of said photoresist material to form leads in electrical contact with said electrically conductive material in said pad regions;
    enlarging said openings in said photoresist material and depositing a second electrically conductive material through said enlarged openings onto an exposed surface of said first electrically conductive material; and
    removing residual photoresist material from said metal layer.

24. The method of claim 23, further including depositing a bondable material onto an exposed surface of said second electrically conductive material.

25. The method of claim 23, wherein the thickness of said first and second electrically conductive materials is less than the thickness of said photoresist material.

26. The method of claim 23, further including at least partially separating said leads from said surface of said substrate.

27. The method of claim 23, further including depositing a bondable material through said openings onto an exposed surface of said first electrically conductive material.

28. The method of claim 27, further including enlarging said openings in said photoresist material and depositing through said enlarged openings a second electrically conductive material over said bondable material.

29. The method claim 28, further including heating said microelectronic component to a temperature to cause said bondable material to reflow.

30. The method of claim 28, further including at least partially separating said leads from said surface of said substrate.

31. The method claim 23, wherein said patterning of said photoresist material to delineate said pad regions occurs prior to patterning of said photoresist material to delineate said lead regions.

32. A method of making a solder ball pad on a lead supported on a dielectric substrate, said method comprising:
    depositing a positive photoresist material over a metal layer supported on said substrate;
    forming an opening in said photoresist material exposing a portion of said metal layer;
    forming a solder ball pad by depositing at least one metal through said opening onto the exposed surface of said metal layer;
    enlarging said opening in said photoresist material and depositing additional material through the enlarged opening onto said solder ball pad;
    removing portions of said metal layer using said photoresist material as a mask to define a lead extending from said solder ball pad over the surface of said substrate; and
    removing said photoresist material from said metal layer.

* * * * *